(12) United States Patent
Lowrey

(10) Patent No.: US 6,757,190 B2
(45) Date of Patent: Jun. 29, 2004

(54) SINGLE LEVEL METAL MEMORY CELL USING CHALCOGENIDE CLADDING

(75) Inventor: Tyler A. Lowrey, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 260 days.

(21) Appl. No.: 09/774,353

(22) Filed: Jan. 30, 2001

(65) Prior Publication Data

US 2002/0039306 A1 Apr. 4, 2002

Related U.S. Application Data

(63) Continuation-in-part of application No. 09/675,285, filed on Sep. 29, 2000, now Pat. No. 6,567,293.

(51) Int. Cl.[7] ............................................... G11C 11/00
(52) U.S. Cl. .............................. 365/163; 365/94; 257/2
(58) Field of Search ....................... 365/94, 163; 257/2, 257/3, 4, 5

(56) References Cited

U.S. PATENT DOCUMENTS

| | | | |
|---|---|---|---|
| 5,296,716 A | | 3/1994 | Ovshinsky et al. |
| 5,789,758 A | | 8/1998 | Reinberg |
| 5,825,046 A | * | 10/1998 | Czubatyj et al. ............... 257/2 |
| 5,879,955 A | | 3/1999 | Gonzalez et al. |
| 5,920,788 A | | 7/1999 | Reinberg |
| 5,933,365 A | | 8/1999 | Klersy et al. |
| 5,970,336 A | | 10/1999 | Wolstenhome et al. |
| 5,998,244 A | | 12/1999 | Wolstenholme et al. |
| 6,002,140 A | | 12/1999 | Gonzalez et al. |
| 6,031,287 A | | 2/2000 | Harshfield |
| 6,087,674 A | | 7/2000 | Ovshinsky et al. |
| 6,153,890 A | | 11/2000 | Wolstenholme et al. |
| 6,229,157 B1 | | 5/2001 | Sandhu |
| 6,339,544 B1 | | 1/2002 | Chiang et al. |

FOREIGN PATENT DOCUMENTS

| | | |
|---|---|---|
| EP | 0 144 604 A2 | 6/1985 |
| WO | WO 96/41380 | 12/1996 |

* cited by examiner

Primary Examiner—Son T. Dinh
(74) Attorney, Agent, or Firm—Trop, Pruner & Hu, P.C.

(57) ABSTRACT

An apparatus including a volume of phase change material disposed between a first conductor and a second conductor on a substrate, and a plurality of electrodes coupled to the volume of phase change material and the first conductor. A method including introducing, over a first conductor on a substrate, a plurality of electrodes coupled to the first conductor, introducing a phase change material over the plurality of electrodes and in electrical communication with the plurality of electrodes, and introducing a second conductor over the phase change material and coupled to the phase change material.

9 Claims, 18 Drawing Sheets

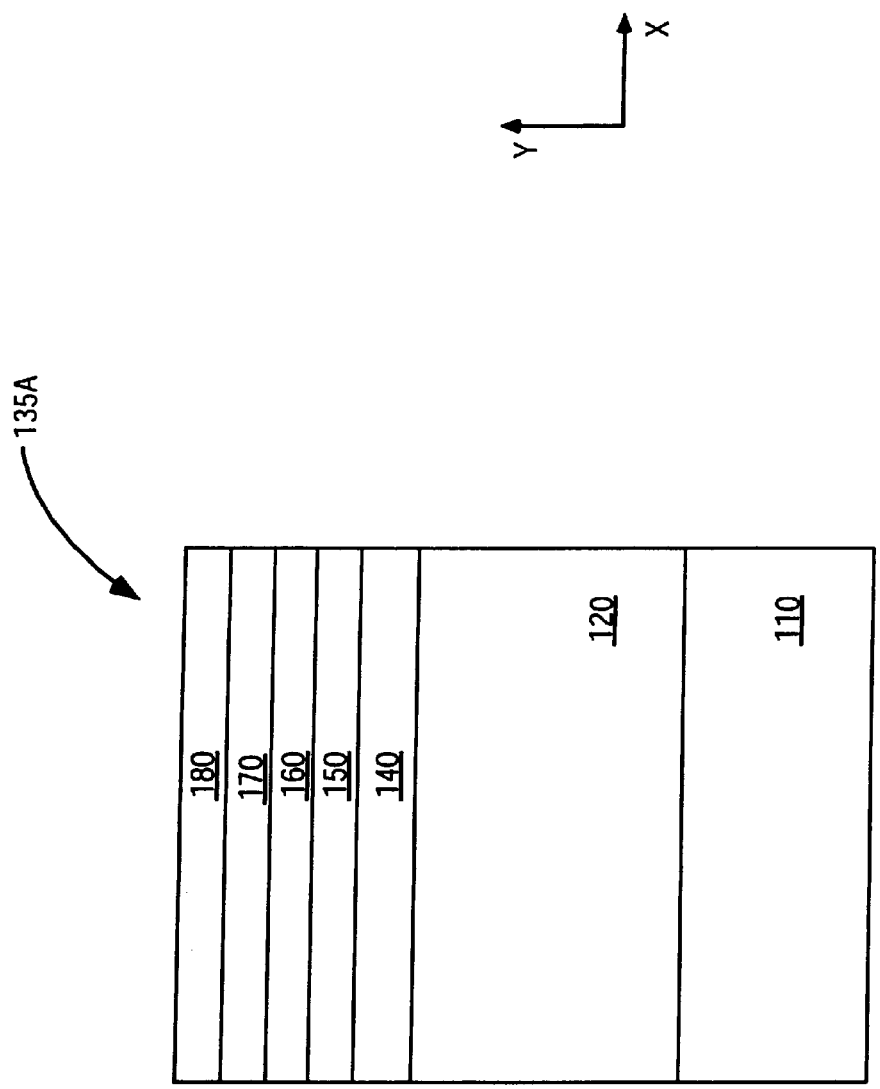

US 6,757,190 B2

SINGLE LEVEL METAL MEMORY CELL USING CHALCOGENIDE CLADDING

This is a continuation-in-part of application Ser. No. 09/675,285 filed Sep. 29, 2000 now Pat. No. 6,567,293.

BACKGROUND OF THE INVENTION

1. Field of the Invention

The invention relates generally to programmable memory devices.

2. Background

Typical memory applications include dynamic random access memory (DRAM), static random access memory (SRAM), erasable programmable read only memory (EPROM), and electrically erasable programmable read only memory (EEPROM).

Solid state memory devices typically employ microelectronic circuit elements for each memory bit (e.g., one to four transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPROM, typically employ a floating gate field effect transistor device that has limited re-programmability and which holds a charge on the gate of field effect transistor to store each memory bit. These classes of memory devices are also relatively slow to program.

Phase change memory devices use phase change materials, i.e., materials that can be electrically switched between a generally amorphous and a generally crystalline state, for electronic memory application. One type of memory element originally developed by Energy Conversion Devices, Inc. of Troy, Michigan utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These electrical memory devices typically do not require field effect transistor select devices, and comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained until reset as that value represents a physical state of the material (e.g., crystalline or amorphous). Thus, phase change memory materials represent a significant improvement in non-volatile memory.

One characteristic of memory devices is the need for addressing lines, such as column and row lines to program and read a memory device. In currently conceived phase change memory devices a column line and a row line address a distinct cell formed over a substrate. The previous structures comprise a double level metal cell structure with the memory element constituting a cell composed of a volume of memory material, an electrode between a row line and the memory material, and an upper electrode overlying the memory material. The cell is coupled to a column line by a via. The via-column line contact requires the cell size of the memory device to be increased to support the contact pitch. It would be desirable in terms of reducing fabrication complexity, cost, and memory cell size to modify the addressing line configuration of a memory cell device.

BRIEF DESCRIPTION OF THE DRAWINGS

FIG. 6 shows the cross-section of the structure of FIG. 4 through line B-B'.

DETAILED DESCRIPTION OF THE INVENTION

The invention generally relates to an apparatus used, in one aspect, as a memory structure. In one embodiment, the apparatus includes a volume of phase change material disposed between a first conductor or signal line and a second conductor or signal line on a substrate, and a plurality of electrodes coupled to the volume of phase change material and the first conductor or signal line. In one aspect, the phase change material is contiguous with the second conductor. In memory device applications, the phase change or memory material is not confined to cellular units. In terms of addressing lines, the second conductor or signal line and the phase change material may be directly adjacent or electrically coupled such that via coupling may be eliminated. In this manner, memory device size can be reduced over prior art structures.

The invention also relates to a method, including a method of introducing, over a first conductor or signal line on a substrate, a plurality of electrodes coupled to the first conductor or signal line; introducing a phase change material over the plurality of electrodes and in electrical communication with the plurality of electrodes; and introducing a second conductor or signal over the phase change material and coupled to the phase change material. Like the apparatus described above, the method includes a method of forming a memory device (or an array of memory devices). The method simplifies prior art fabrication techniques by eliminating alignment issues of addressing line to memory material and via to addressing line. The method also eliminated prior art sizing constraints imposed by an overlying via coupling to address the memory material.

In the following paragraphs and in association with the accompanying figures, an example of a memory device formed according to an embodiment of the invention is presented. The embodiment describes a memory material including a phase change material wherein the phase of the material determines the state of the memory element.

Figure 1:
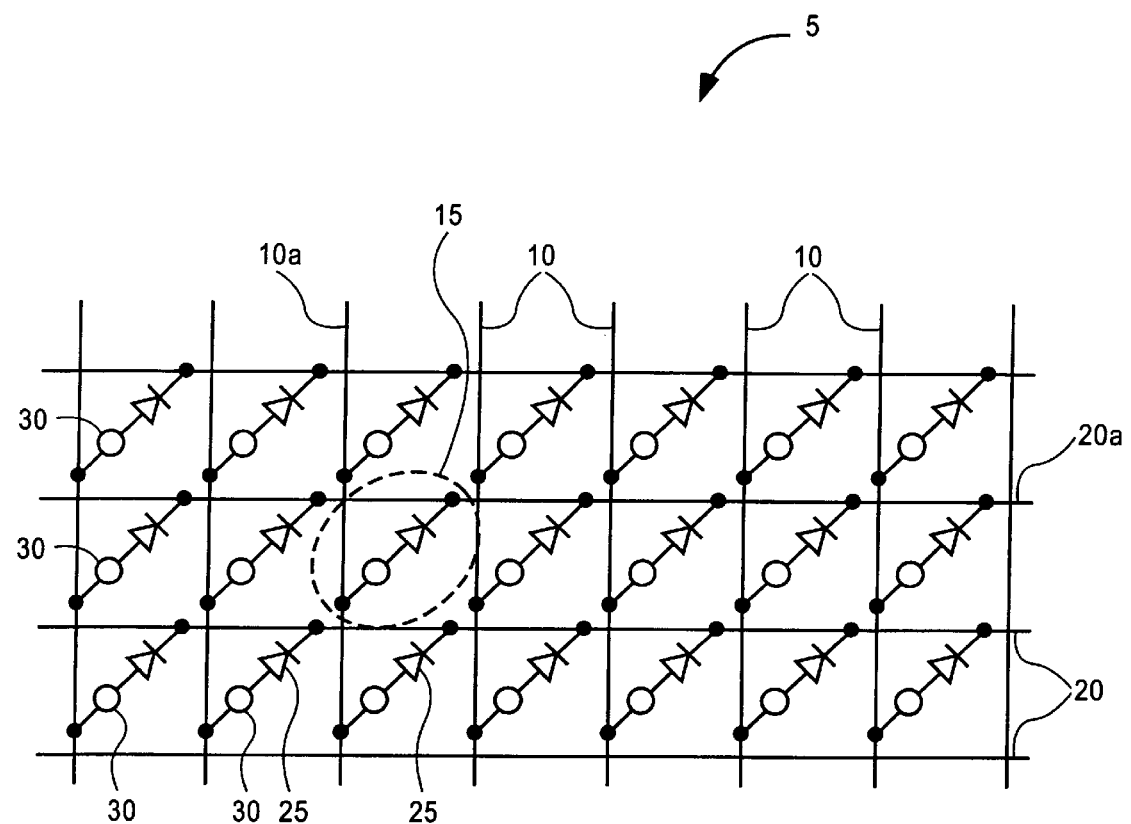
FIG. 1 is a schematic diagram of an array of memory elements according to an embodiment of the invention.

FIG. 1 shows a schematic diagram of an embodiment of a memory array comprised of a plurality of memory elements presented and formed in the context of the invention. In this example, the circuit of memory array 5 includes an xy grid with memory element 30 electrically interconnected in series with isolation device 25 on a portion of a chip. Address lines 10 (e.g., columns) and 20 (e.g., rows) are connected, in one embodiment, to external addressing circuitry in a manner known to those skilled in the art. One purpose of the xy grid array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer reduced through singulation into discrete die or chips, some or all of the die or chips having a memory array formed thereon. Additional addressing circuitry (e.g., decoders, etc.) may be formed in a similar fashion as known to those of skill in the art.

Figure 2:
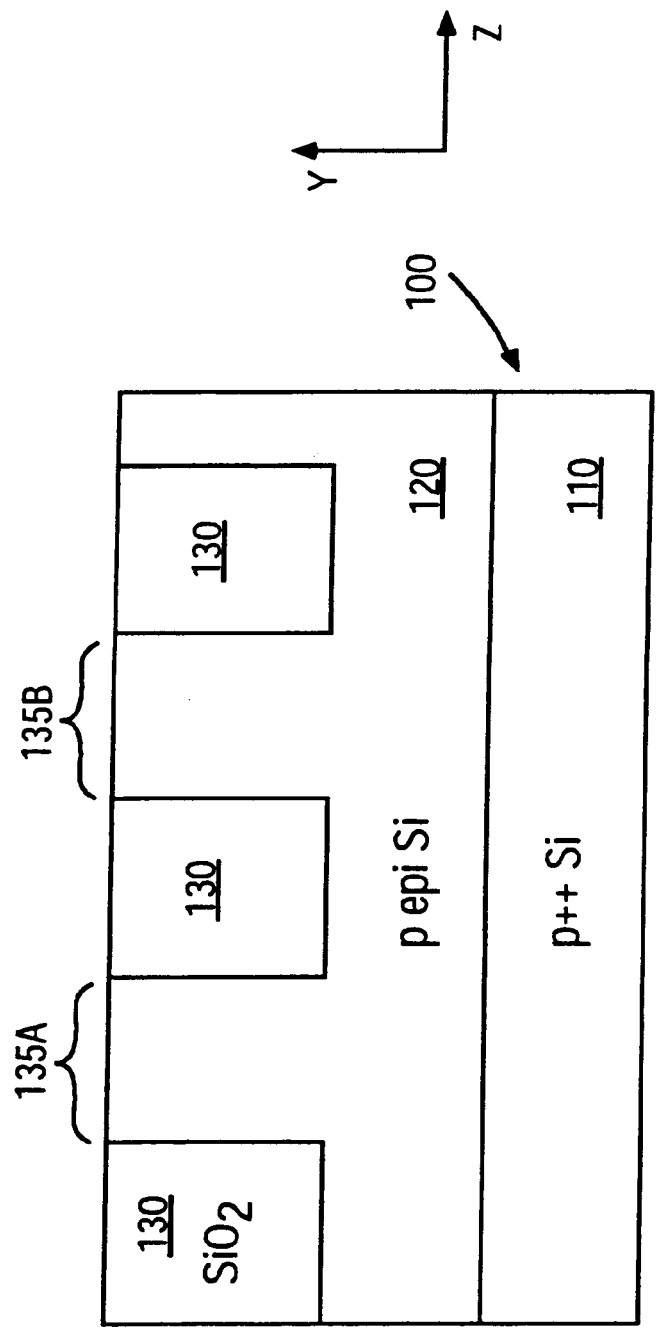
FIG. 2 schematically illustrates a cross-sectional planar side view of a portion of a semiconductor substrate having dielectric trenches formed therein defining a z-direction thickness of a memory cell in accordance with one embodiment of the invention of forming a memory element on a substrate.

FIGS. 2–18 illustrate the fabrication of representative memory element 15 of FIG. 1. FIG. 2 shows a portion of substrate 100 that is, for example, a semiconductor substrate. In this example, a P-type dopant such as boron is introduced in portion 110. In one example, a suitable concentration of P-type dopant is on the order of above $5 \times 10^{18} - 1 \times 10^{20}$ atoms per cubic centimeters (atoms/cm$^3$) rendering portion 110 of substrate 100 representatively P$^{++}$. Overlying portion 110 of substrate 100, in this example, is portion 120 of P-type epitaxial silicon. In one example, the dopant concentration is on the order of about $10^{15} - 10^{7}$ atoms/cm$^3$. The introduction and formation of P-type epitaxial silicon portion 120 and P$^{++}$ silicon portion 110 may follow techniques known to those of skill in the art.

FIG. 2 also shows shallow trench isolation (STI) structures 130 formed in epitaxial portion 120 of substrate 100. As will become apparent in the subsequent discussion, STI structures 130 serve, in one aspect, to define the z-direction thickness of a memory element cell, with at this point only the z-direction thickness of a memory element cell defined. In another aspect, STI structures 130 serve to isolate individual memory elements from one another as well as associated circuit elements (e.g., transistor devices) formed in and on the substrate. STI structures 130 are formed according to techniques known to those skilled in the art.

Figure 3:
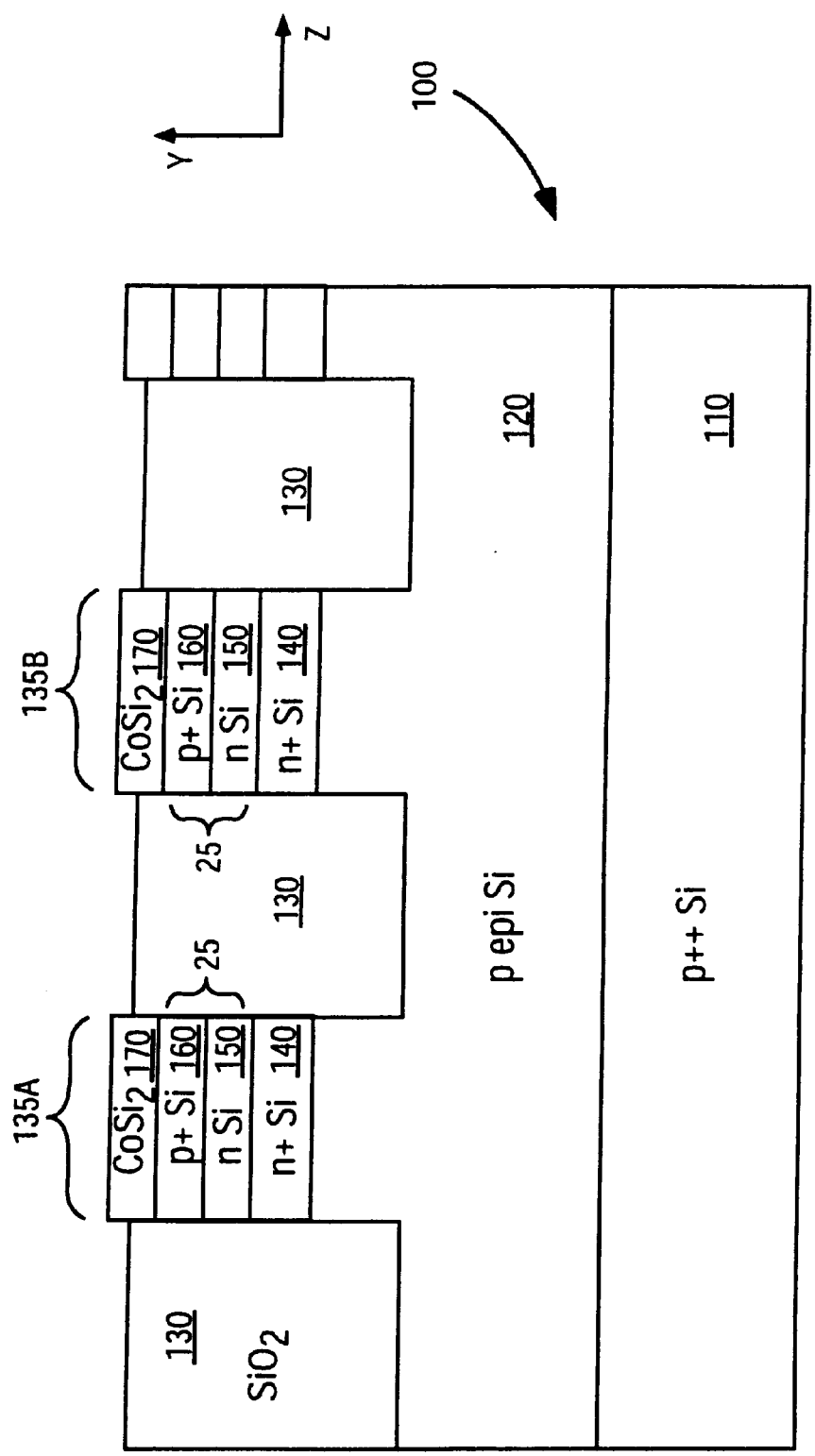
FIG. 3 shows the structure of FIG. 2, through the same cross-sectional view, after the introduction of dopants to form an isolation device for a memory element in accordance with one embodiment of the invention.

FIG. 3 shows the structure of FIG. 2 after a further fabrication operation in memory cell regions 135A and 135B. In one embodiment, memory cell regions 135A and 135B are introduced as strips with the x-direction dimension greater than the z-direction dimension. Overlying epitaxial portion 120 of substrate 100 is first conductor or signal line material 140. In one example, first conductor or signal line material 140 is N-type doped polysilicon formed by the introduction of, for example, phosphorous or arsenic to a concentration on the order of about $10^{18} - 10^{20}$ atoms/cm$^3$ (e.g., N$^+$ silicon). In this example, first conductor or signal line material 140 serves as an address line, a row line (e.g., row line 20 of FIG. 1). Overlying first conductor or signal line material 140 is an isolation device (e.g., isolation device 25 of FIG. 1). In one example, the isolation device is a PN diode formed of N-type silicon portion 150 (dopant concentration on the order of about $10^{16} - 10^{18}$ atoms/cm$^3$) and P-type silicon portion 160 (dopant concentration on the order of about $10^{18} - 10^{20}$ atoms/cm$^3$). Although a PN diode is shown, it is to be appreciated that other isolation structures are similarly suitable. Such devices include, but are not limited to, MOS devices.

Referring to FIG. 3, overlying the isolation device in memory cell regions 135A and 135B is conductive material 170 of, in this example, a refractory metal silicide such as cobalt silicide (CoSi$_2$). Conductive material 170, in one aspect, serves as a low resistance material in the fabrication of peripheral circuitry (e.g., addressing circuitry) of the circuit structure on the chip. Thus, conductive material 170 is not required in terms of forming a memory element as described. Nevertheless, because of its low resistance property, its inclusion as part of the memory cell structure between isolation device 25 and memory element 30 is utilized in this embodiment.

Figure 4:
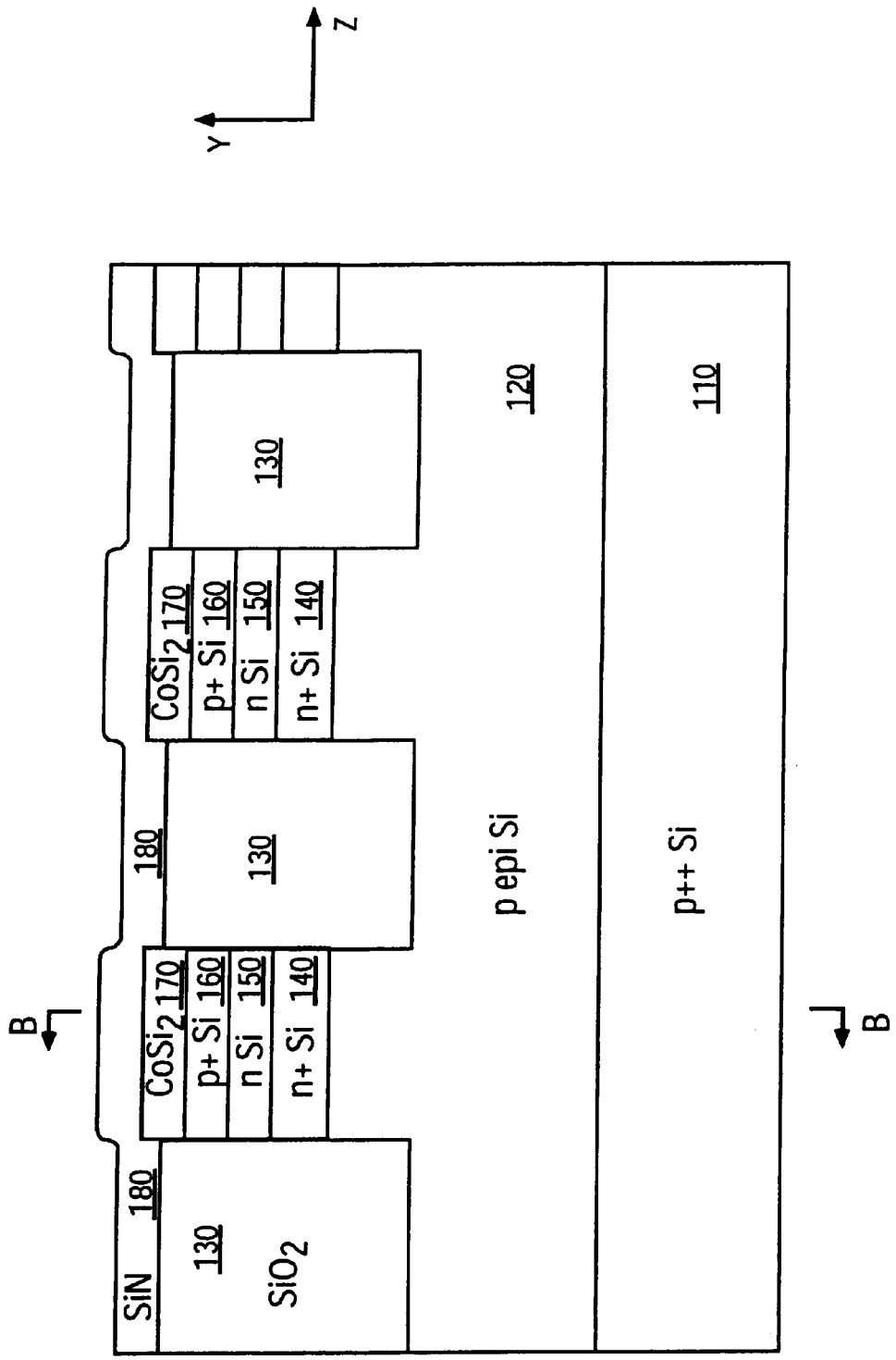
FIG. 4 shows the structure of FIG. 3 after the introduction of a dielectric material over the structure in accordance with one embodiment of the invention.
Figure 5:
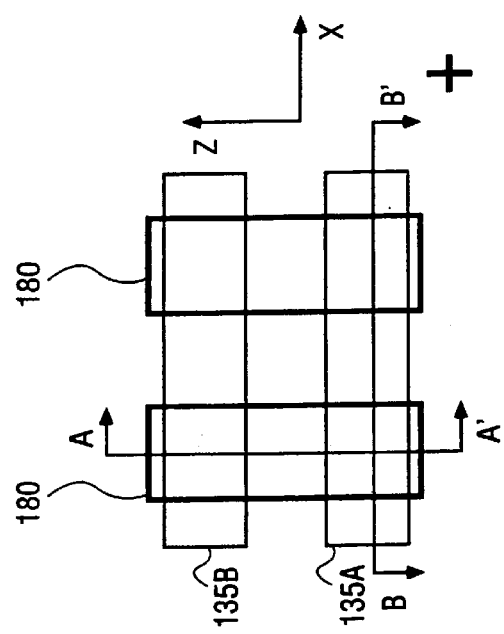
FIG. 5 shows a schematic top view of the structure of FIG. 4.

FIG. 4 shows the structure of FIG. 3 after the introduction of dielectric material 180. As will become clear later, dielectric material 180 serves, in one sense, as an etch stop for a subsequent etch operation. FIG. 5 schematically shows memory cell regions 135A and 135B in an xz plane. Overlying the memory cell is dielectric material 180. FIG. 6 shows a cross-sectional side view of memory cell region 135A through line B–B' of FIG. 5 (i.e., an xy perspective). In one embodiment, a suitable material for dielectric material 180 is a dielectric such as silicon nitride ($Si_3N_4$).

Figure 7:
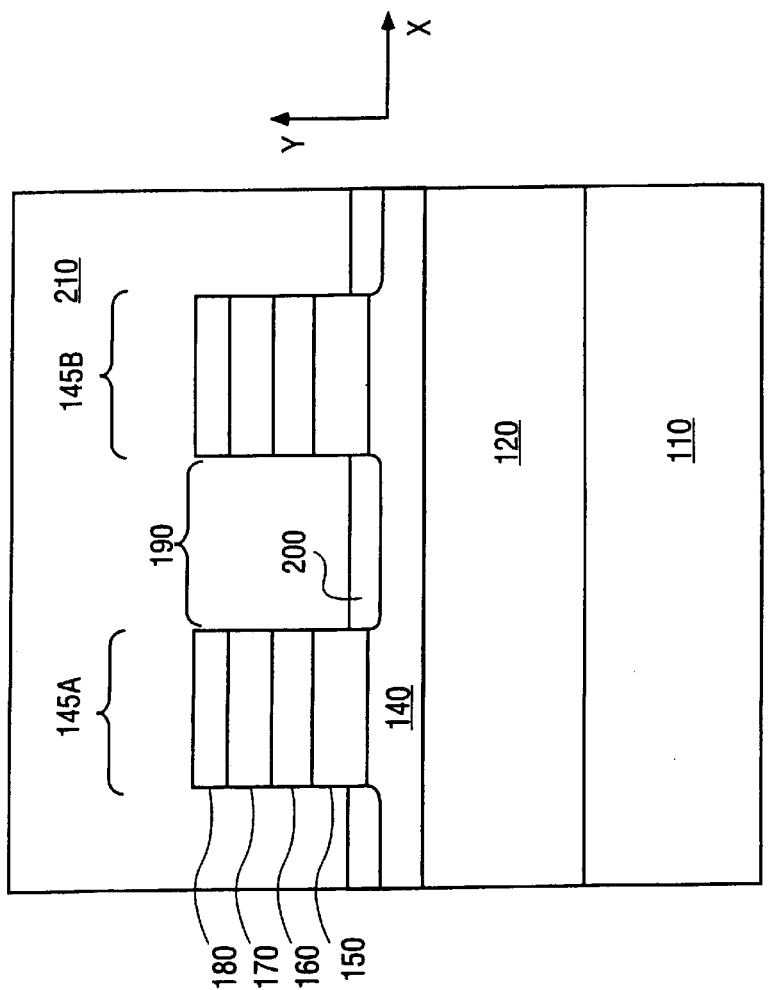
FIG. 7 shows the structure of FIG. 5, through the same cross-sectional view, after the patterning of the x-direction thickness of a memory cell, the introduction of a dopant between the cells, and the introduction of a dielectric material over the structure.

FIG. 7 shows the structure of FIG. 6 (from an xy perspective) after patterning of the x-direction thickness of the memory cell material. FIG. 7 shows two memory cells 145A and 145B patterned from memory cell region 135A (see FIG. 5). The patterning may be accomplished using conventional techniques for etching, in this example, refractory metal silicide and silicon material to the exclusion of dielectric material 180 (e.g., $Si_3N_4$). The definition of the x-direction thickness involves, in one embodiment, an etch to conductive material 150 of the memory line stack to define memory cells 145A and 145B of memory cell region 135A. In the case of an etch, the etch proceeds through the memory line stack to, in this example, a portion of conductor or signal line material 150. A timed etch may be utilized to stop an etch at this point. Following the patterning, N-type dopant is introduced at the base of each trench 190 to form pockets 200 having a dopant concentration on the order of about $10^{18}$–$10^{20}$ atoms/cm$^3$ (e.g., $N^+$ region) between memory cells 145A and 145B. Pockets 200 serve, in one sense, to maintain continuity of a row line. Dielectric material 210 of, for example, silicon dioxide material is then introduced over the structure to a thickness on the order of 100 Å to 50,000 Å.

Figure 8:
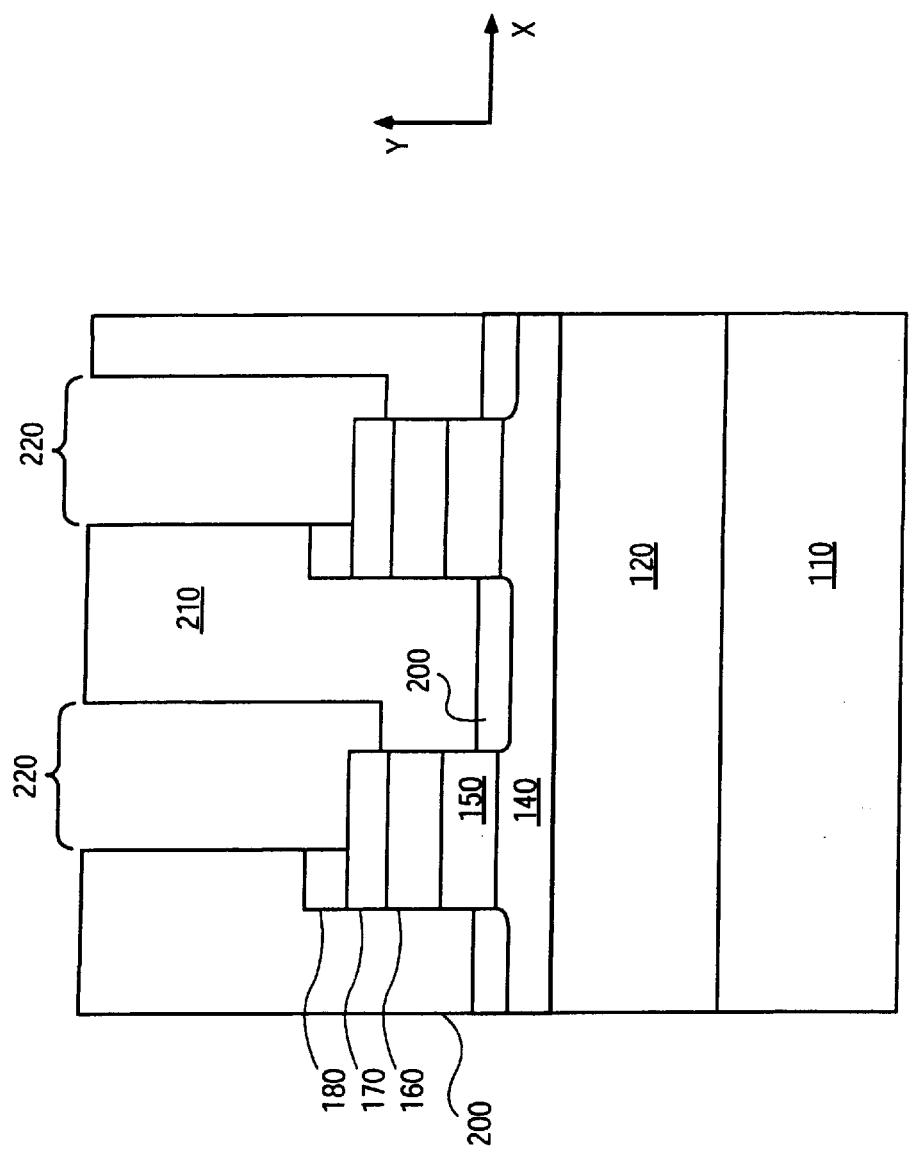
FIG. 8 shows the structure of FIG. 7, through the same cross-sectional view, after the formation of trenches through the dielectric material in accordance with one embodiment of the invention.

FIG. 8 shows the structure of FIG. 7 after the formation of trenches 220 through dielectric materials 210 and 180 to conductive material 170. The formation of trenches 220 may be accomplished using etch patterning with an etchant(s) selective for etching dielectric material 210 and dielectric material 180 and not conductive material 170 (e.g., conductive material 170 serving as an etch stop).

Figure 9:
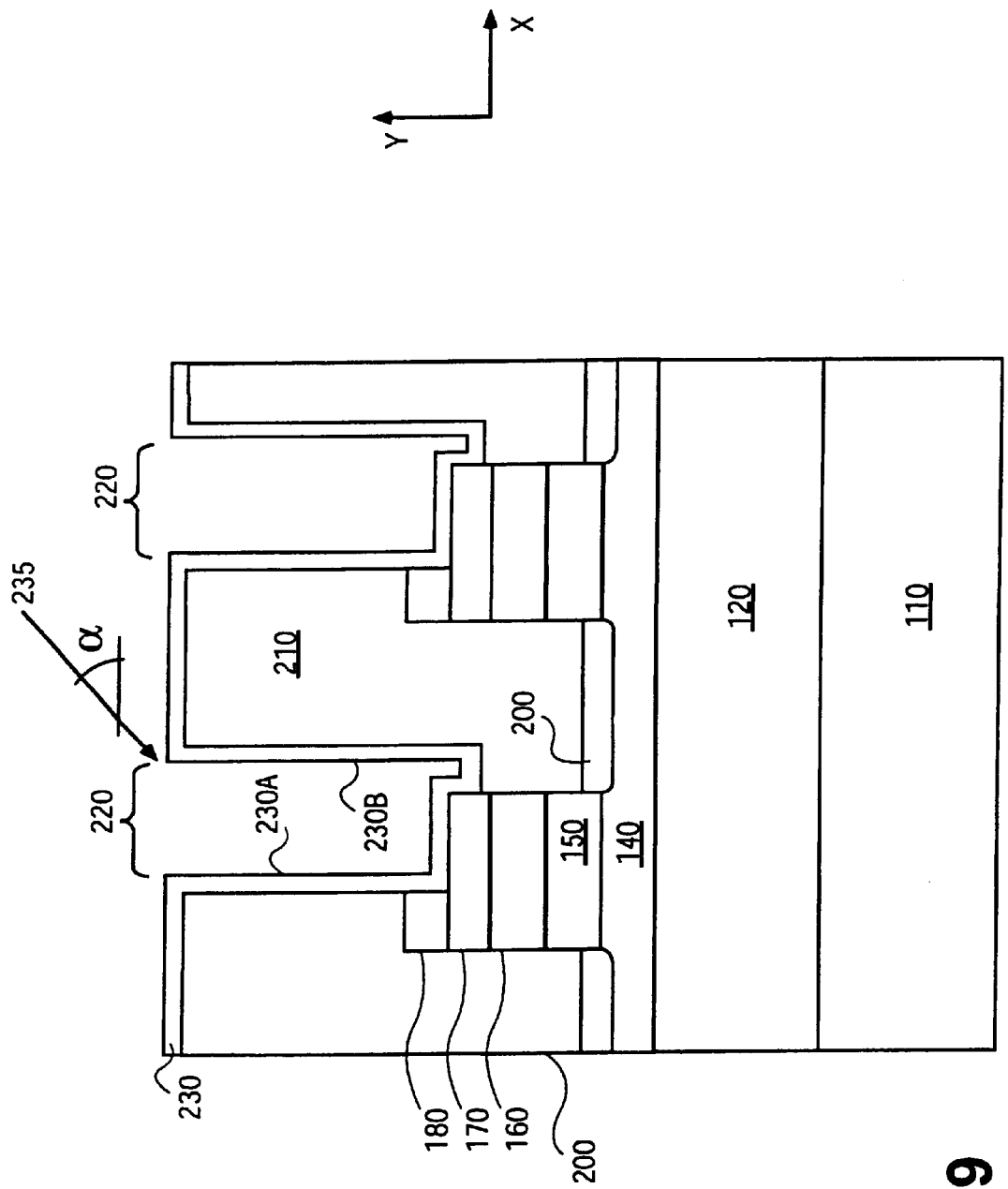
FIG. 9 shows the structure of FIG. 8, through the same cross-sectional view, after the introduction of an electrode material over the structure in accordance with one embodiment of the invention.

FIG. 9 shows the structure of FIG. 8 after the conformal introduction of electrode material 230. In one example, electrode material 230 is polycrystalline semiconductor material such as polycrystalline silicon. Other suitable electrode material include carbon and semi-metals such as transition metals, including but not limited to titanium, tungsten, titanium nitride (TiN) and titanium aluminum nitride (TiAlN). The introduction is conformal in the sense that electrode material 230 is introduced along the side walls and base of trench 220 such that electrode material 230 is in contact with conductive material 170. The conformal introduction of electrode material 230 that is polycrystalline silicon, for example, may follow conventional introduction techniques known to those skilled in the art, including chemical vapor deposition (CVD) techniques, to, for example, a film thickness on the order of about 50 to 350 angstroms according to current technology.

In the example where electrode material 230 is semiconductor material such as polycrystalline silicon, following the introduction of electrode material 230, a dopant is introduced into the polycrystalline silicon to, in one aspect, lower the resistance of the material. In the example shown, a suitable dopant is a P-typed dopant such as boron introduced to a concentration on the order of about $10^{18}$–$10^{20}$ atoms/cm$^3$. In one embodiment, the dopant is introduced at an angle such that electrode material 230A along a side wall of trench 220 is primarily exposed to the dopant while electrode material 230B is exposed to little or no dopant. In this manner, the resistance of electrode material 230A may be reduced below the resistance of electrode material 230B. In the case of polycrystalline silicon, in one example, electrode material 230B is substantially intrinsic silicon. In another embodiment, electrode material 230A is counter-doped. A first dopant introduced along a portion of electrode material 230A (again at an angle) adjacent conductive material 170 is of a first type (e.g., $P^+$-type). A second dopant may be of a second type (e.g., $N^+$-type) introduced at the top portion of electrode material 230A. U.S. patent application Ser. No. 09/620,318, filed Jul. 22, 2000, titled "Electrically Programmable Memory Element Having Sidewall Contact and Method for Making Same" describes counter-doping electrode material.

Figure 10:
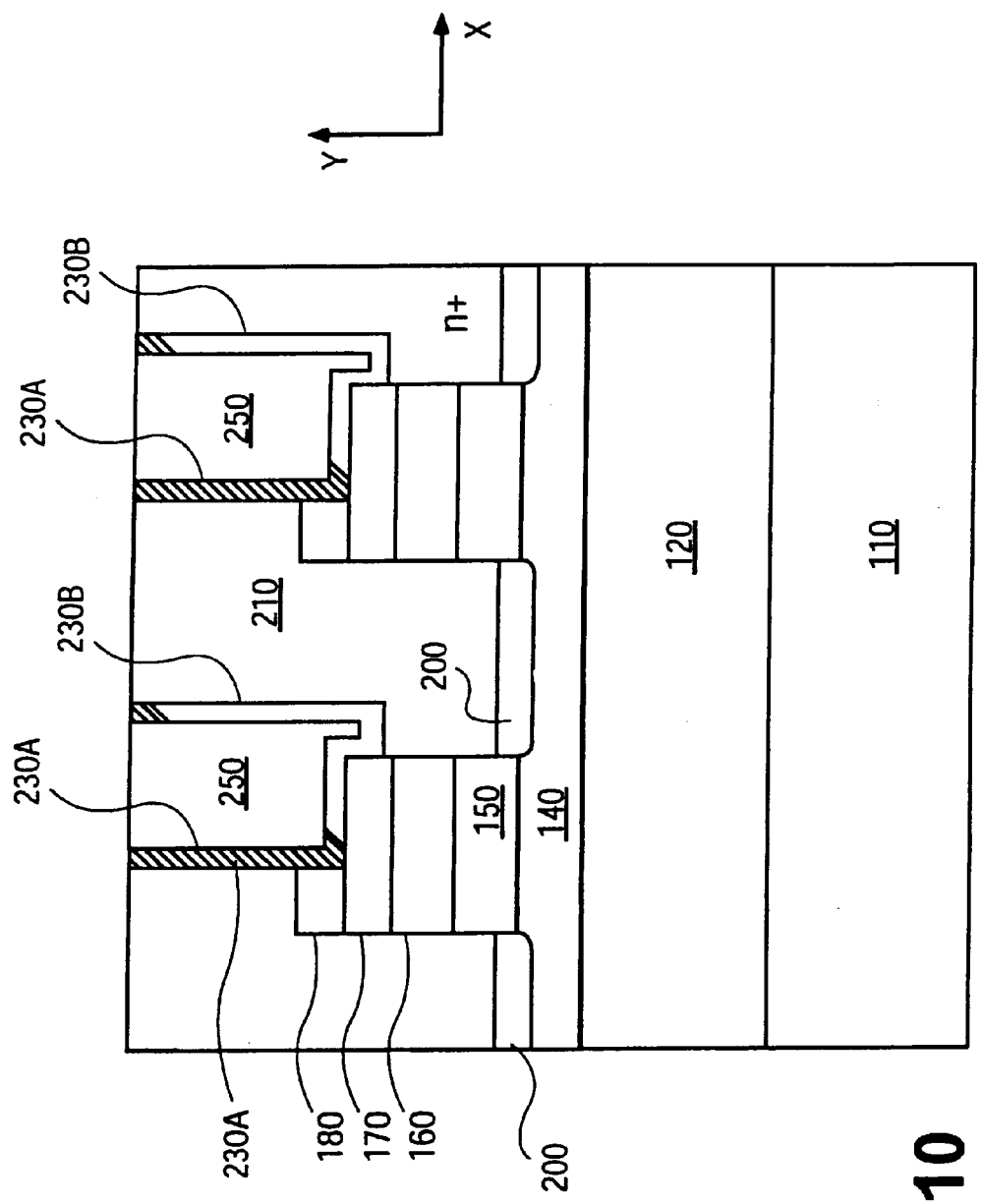
FIG. 10 shows the structure of FIG. 9, through the same cross-sectional view, after the introduction of a dopant into the electrode material in accordance with one embodiment of the invention.

FIG. 10 shows the structure of FIG. 9 after the introduction of a dopant into electrode material 230A. As illustrated, the electrode material 230A is doped (with one dopant or counter-doped) about its length from conductive material 170. FIG. 10 also shows the structure after the introduction of dielectric material 250 into trenches 220 and a planarization step that removes the upper horizontal component of electrode material 230. Suitable planarization techniques include those known to those of skill in the art, such as dry etch or chemical-mechanical polish (CMP) techniques.

Figure 11:
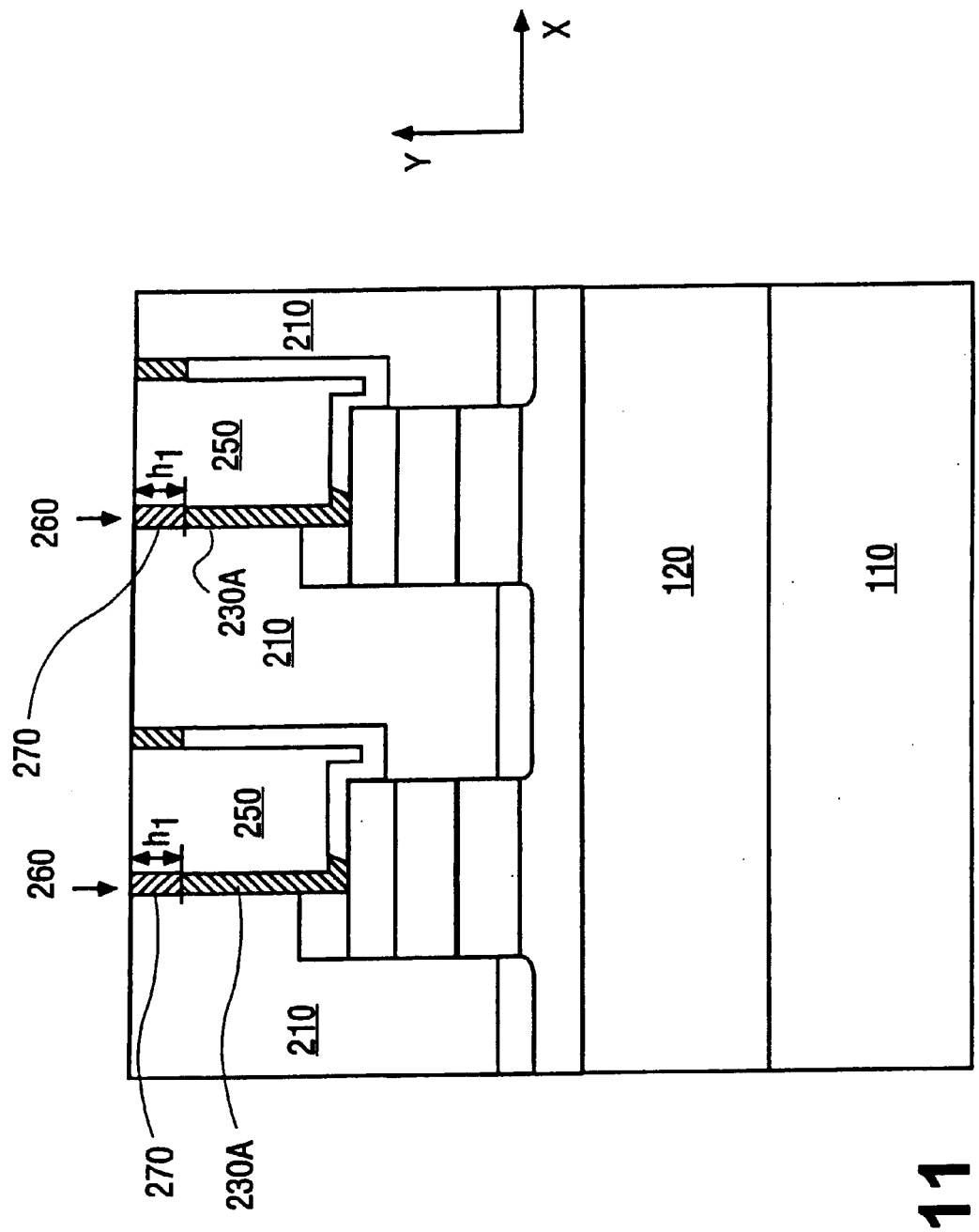
FIG. 11 shows the structure of FIG. 10, through the same cross-sectional view, after the introduction of a modifying species into a portion of the electrode material in accordance with one embodiment of the invention.

FIG. 11 shows the structure of FIG. 10 after the optional introduction of counter-dopant or modifying species 260 into a portion of electrode material 230A. In one embodiment, modifying species 260 is introduced to raise the local resistance of electrode material 230A at a portion of electrode material 270 defined by length, $h_1$. Electrode material 270 of polycrystalline silicon and $SiO_2$, $Si_3N_4$, $Si_xO_yN_z$, or SiC generally has a higher resistivity than doped polycrystalline silicon of electrode material 230A. Suitable materials for modifying species also include those materials that are introduced (e.g., added, reacted, or combined) into electrode material 230A and raise the resistivity value within the electrode (e.g., raise the local resistance near a volume of memory material), and the resistivity value is also stable at high temperatures. Such modifying species may be introduced by way of implantation or thermal means with, for example, a gaseous ambient.

As described above, electrode material 270 will be substantially adjacent to a memory material. Electrode material 270 may be selected also for its surface chemical composition in promoting adhesion of a subsequently introduced volume of memory material. In some cases, electrode material 270 with the included modifier may not provide sufficiently suitable ohmic contact between the electrode and the memory material for a desired application. In such cases, modifying material may be introduced into the electrode at a depth below the exposed surface of the electrode. In the example described, an electrode of polycrystalline silicon may have polycrystalline silicon at the exposed surface (referring to FIG. 11) and modifying material 270 at a depth below the exposed surface but not throughout or adjacent for the exposed surface (e.g., 200–1000 Å below the exposed surface). In one example, a second introduction (e.g., deposition) may also be employed to follow the introduction of electrode material 270 and locate polycrystalline silicon adjacent the exposed surface of the electrode.

Figure 12:
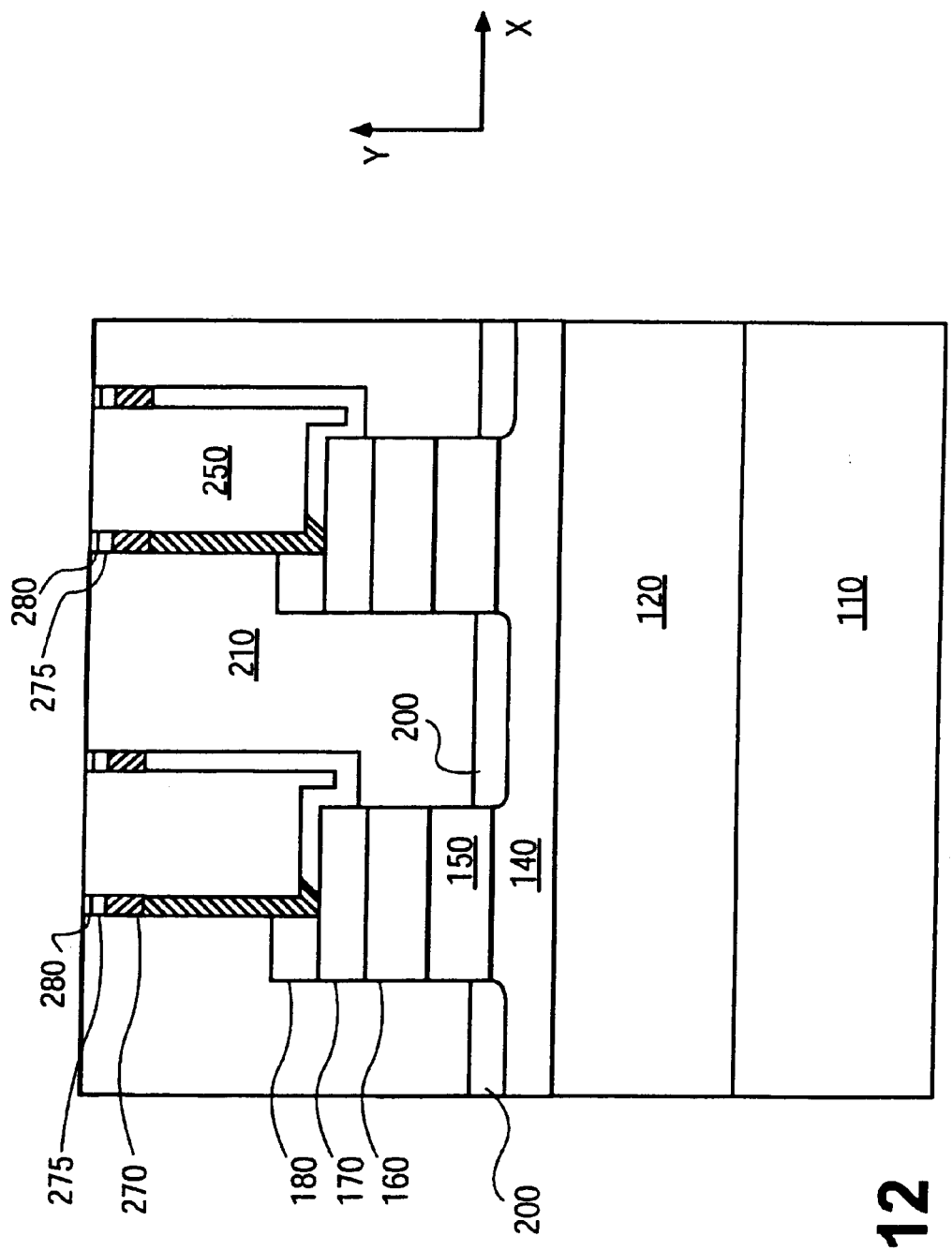
FIG. 12 shows the structure of FIG. 11, through the same cross-sectional view, after the introduction of barrier material over the electrode in accordance with one embodiment of the invention.

FIG. 12 shows the structure of FIG. 11 after the optional introduction of barrier materials 275 and 280. Barrier material 275 is, for example, titanium silicide (TiSi$_2$) introduced to a thickness on the order of about 50–300 Å. Barrier material 280 is, for example, titanium nitride (TiN) similarly introduced to a thickness on the order of about 25–300 Å. The introduction of barrier materials 275 and 280 may be accomplished using techniques known to those skilled in the art.

Figure 13:
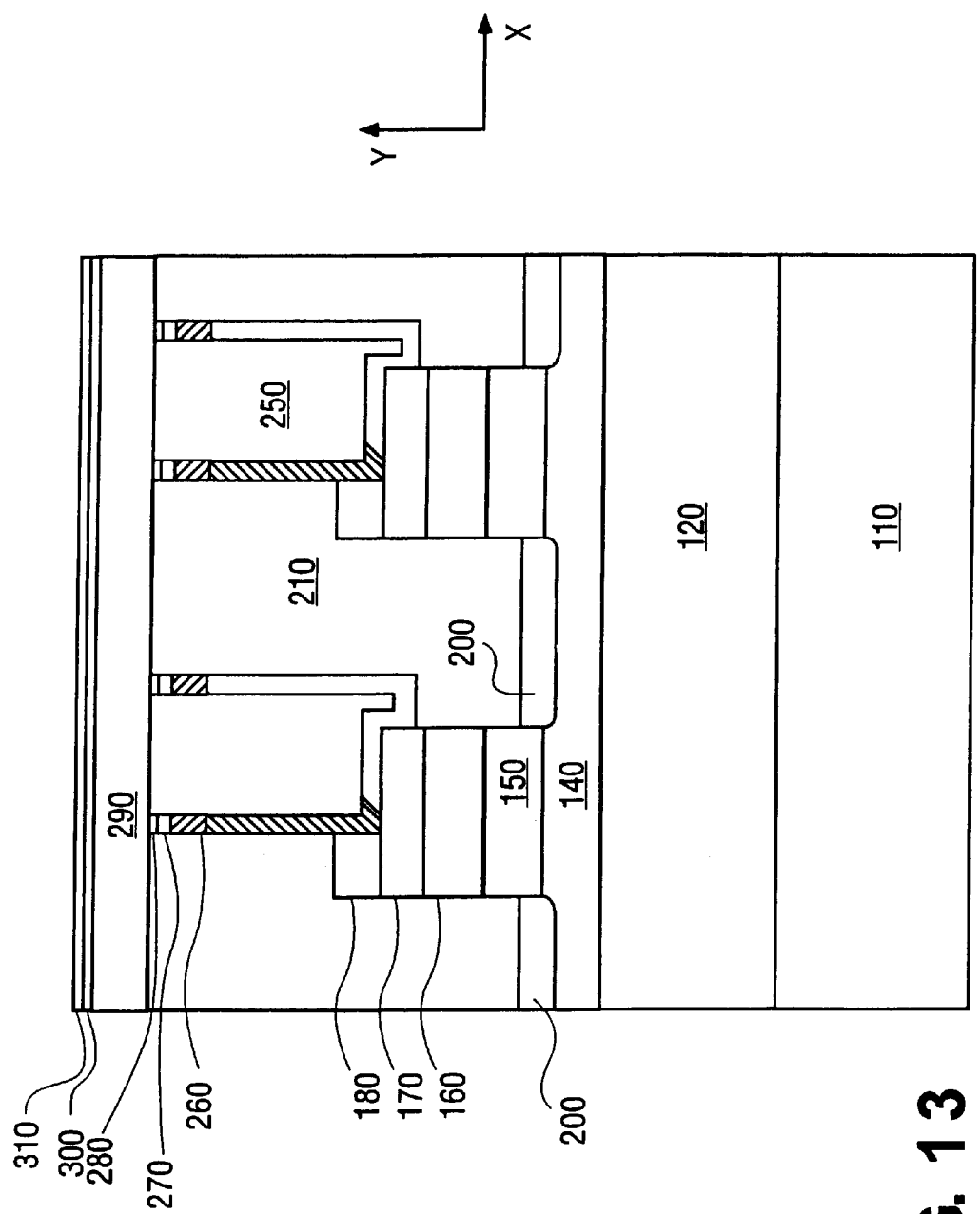
FIG. 13 shows the structure of FIG. 12, through the same cross-sectional view, after the conformal introduction of a volume of memory material and barrier materials over the structure, in accordance with one embodiment of the invention.

FIG. 13 shows the structure of FIG. 12 after the introduction of memory material 290. In one example, memory material 290 is a phase change material. In a more specific example, memory material 290 includes a chalcogenide element(s). Examples of phase change memory material 290 include, but are not limited to, compositions of the class of tellerium-germanium-antimony (Te$_x$Ge$_y$Sb$_z$) material. Memory material 290, in one example according to current technology, is introduced conformally over the substrate to a thickness on the order of about 300 to 600Å.

Overlying memory material 290 in the structure of FIG. 13 are optional barrier materials 300 and 310 of, for example, titanium (Ti) and titanium nitride (TiN), respectively. Barrier material serves, in one aspect, to inhibit diffusion between the volume of memory material 290 and second conductor or signal line material overlying the volume of memory material 290 (e.g., second conductor 10). Methods for the conformal introduction of barrier materials include such techniques as known to those skill in the art, such a physical vapor deposition (PVD) process.

Figure 14:
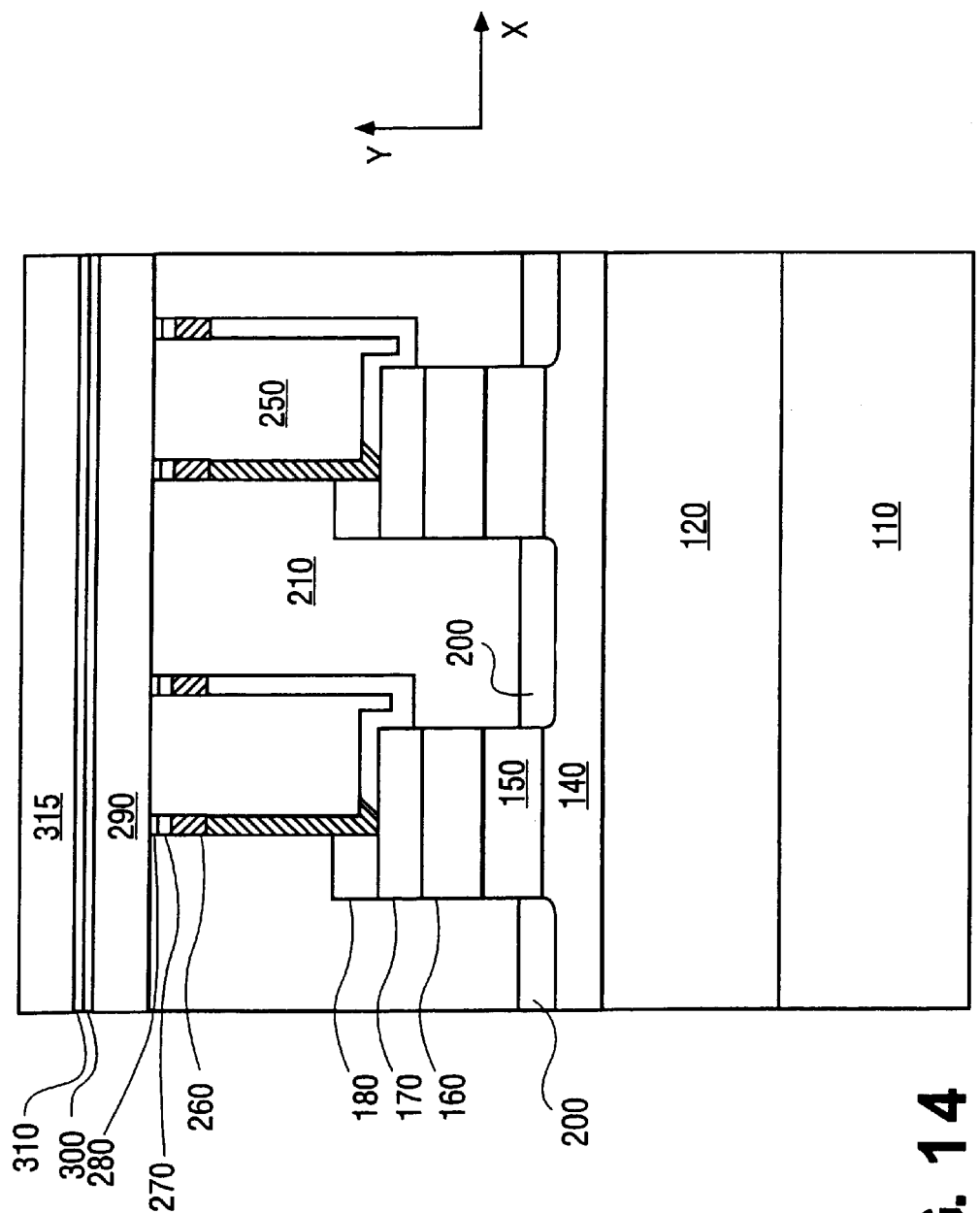
FIG. 14 shows the structure of FIG. 13 after the conformal introduction of second conductor or signal line material over the structure in accordance with an embodiment of the invention.

FIG. 14 shows the structure of FIG. 13 after the conformal introduction of second conductor or signal line material 315 over barrier materials 300 and 310. In this example, second conductor or signal line material 315 serves as an address line, a column line (e.g., column line 10 of FIG. 1). Second conductor or signal line material 315 is, for example, an aluminum (Al) material, such as an aluminum alloy, or a tungsten (W) material. Methods for the introduction of second conductor or signal line material 315 include such techniques as known to those of skill in the art such as a PVD process. Second conductor or signal line material 315 is introduced, in one embodiment, to a thickness on the order of 1000 to 10,000Å.

In one embodiment, following the introduction of second conductor or signal line material 315 over barrier materials 300 and 310, second conductor or signal line material 315, barrier materials 300 and 310, and memory material 290 are patterned into continuous strips. In this manner, memory material 290 is contiguous with second conductor or signal line material 315. According to one example, second conductor or signal line material 315, barrier materials 300 and 310, and memory material 290 are patterned into strips approximately one lithographic feature size wide (e.g., 25 microns according to current technology) and generally orthogonal to first conductor or signal line material 140 (e.g., column lines are orthogonal to row lines). Conventional photolithography techniques may be performed as known in the art to accomplish the patterning including the introduction of a photosensitive masking material to define a dimension of the strips of column material and memory material (e.g., an x dimension) and etching according to the masking material with an etchant or etchants selective for etching second conductor or signal line material 315 and memory material 290.

Figure 15:
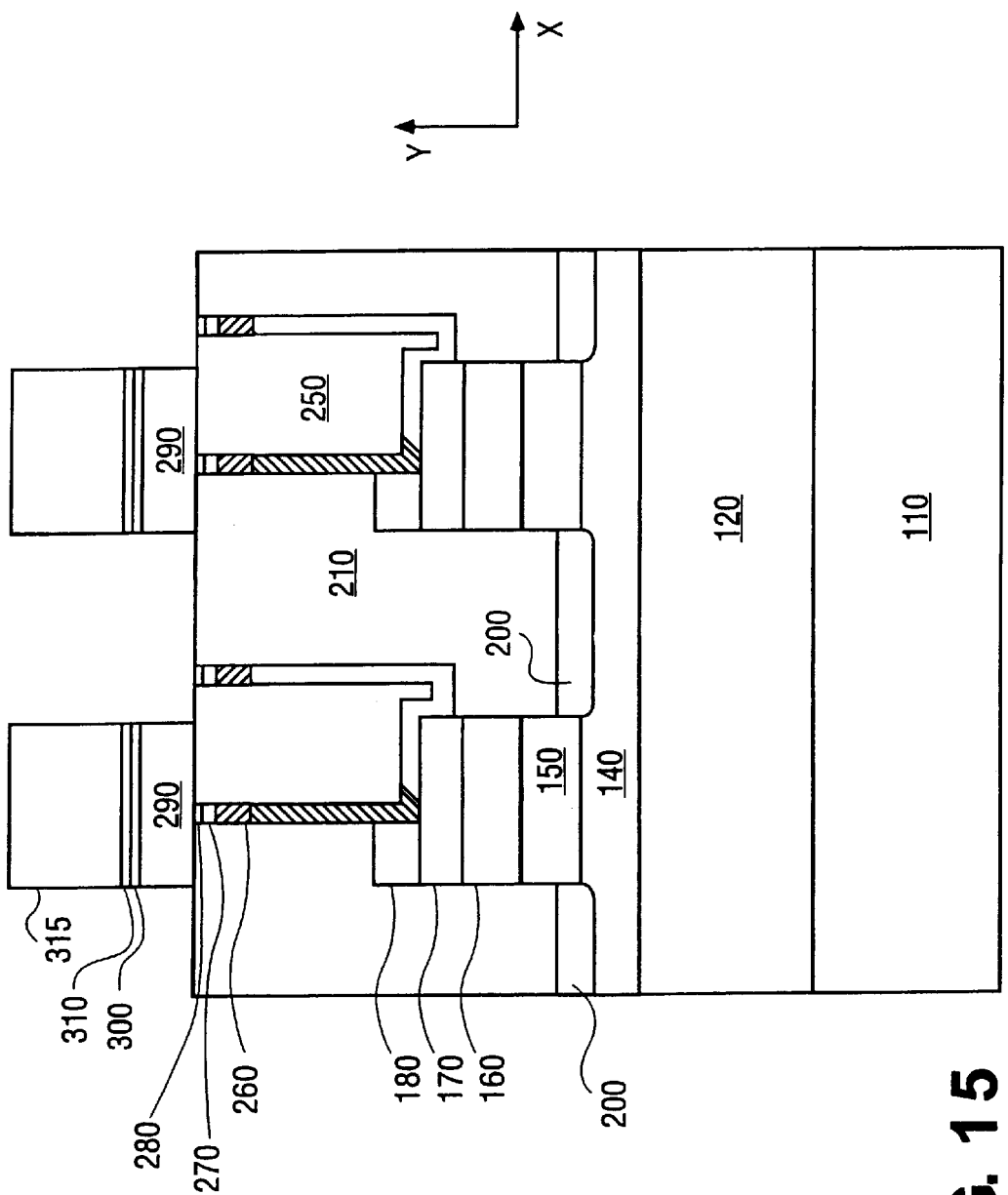
FIG. 15 shows the structure of FIG. 14 after patterning the second conductor or signal line material and the memory material into contiguous strips in accordance with an embodiment of the invention.
Figure 16:
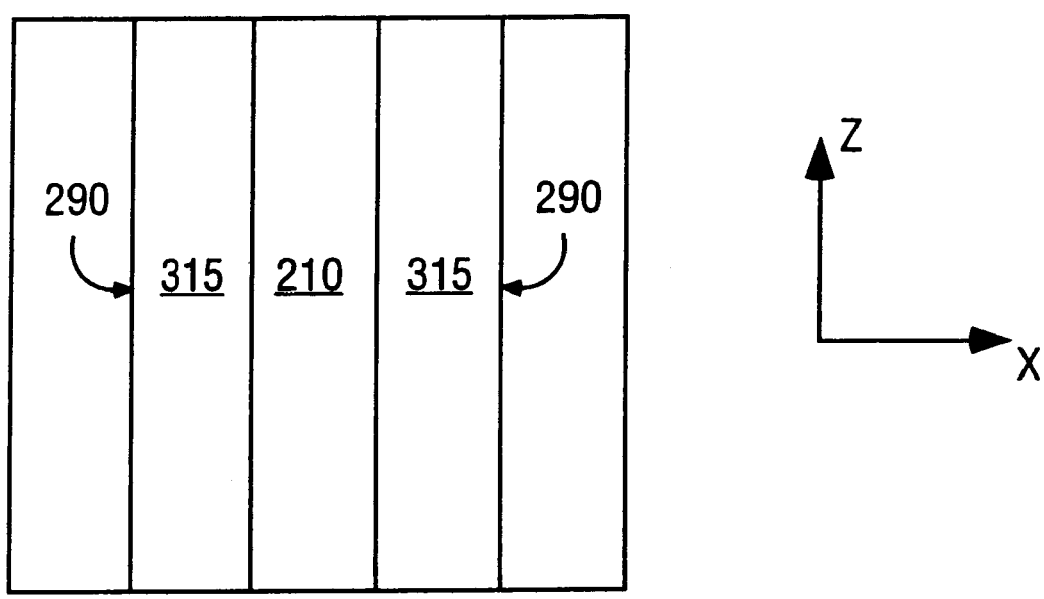
FIG. 16 shows a schematic top view of the structure of FIG. 15.

FIG. 15 shows the structure after patterning second conductor or signal line material 315, barrier materials 300 and 310, and memory material 290. FIG. 16 shows a planar top view of the structure in an xz plane and illustrates second conductor or signal line material 315, barrier materials 300 and 310, and memory material 290 patterned as continuous strips over a portion of the substrate. The representation of second conductor or signal line material 315 and memory material 290 as continuous strips represents an embodiment of a suitable patterning. It is to be appreciated that, in certain instances, it may be desirable to pattern such materials in a discontinuous manner.

Figure 17:
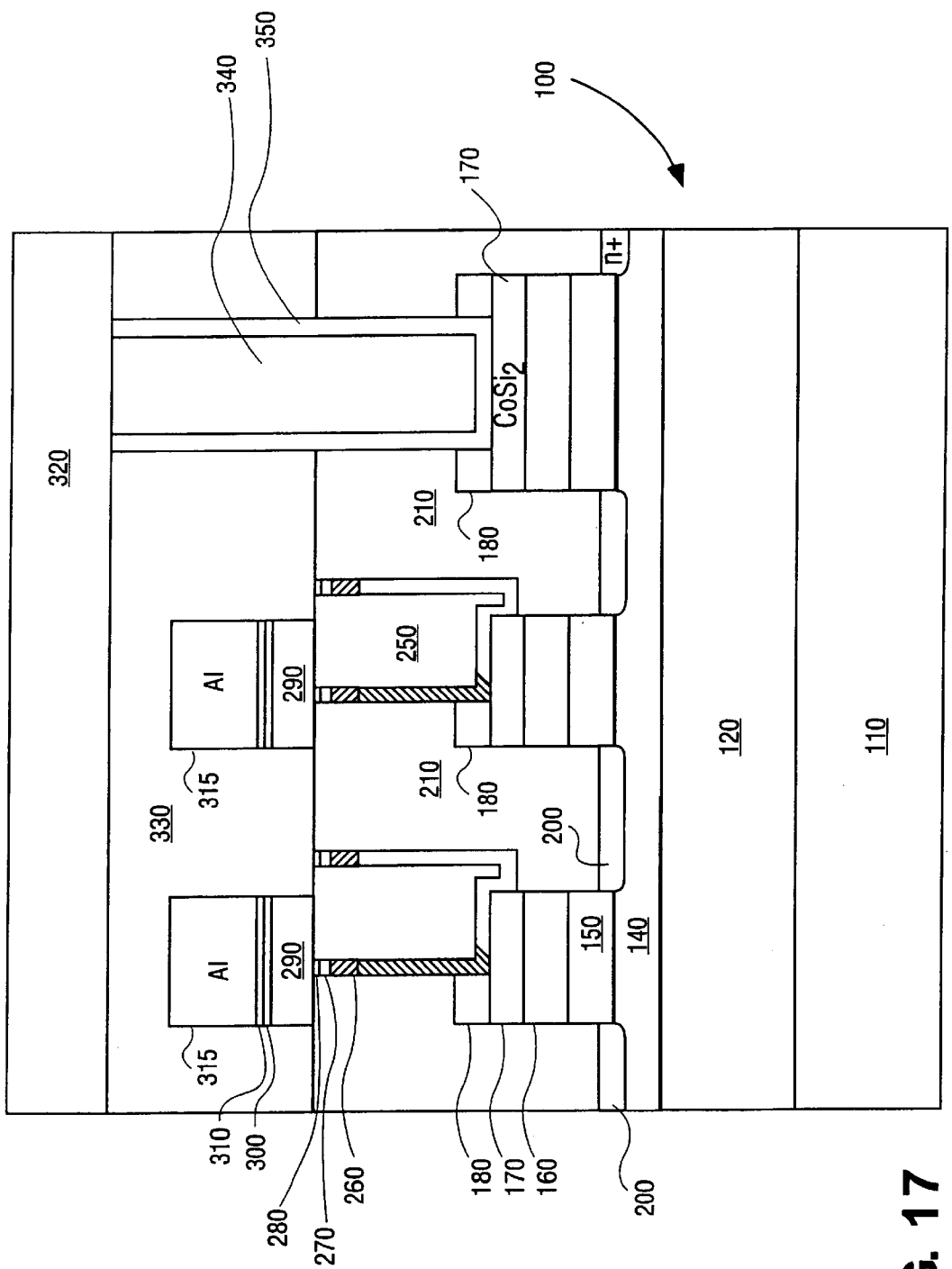
FIG. 17 shows the structure of FIG. 15, through the same cross-sectional view, after the introduction of the dielectric material over the second conductor and a third conductor coupled to the first conductor in accordance with an embodiment of the invention.

FIG. 17 shows the structure of FIG. 15 after the introduction of dielectric material 330 over second conductor or signal line material 315. Dielectric material 330 is, for example, SiO$_2$ or other suitable material that surrounds second conductor or signal line material 315 and memory material 290 to electronically isolate such structure. Following introduction, dielectric material 330 is planarized and a via is formed in a portion of the structure through dielectric material 330, dielectric material 210, and dielectric material 180 to conductive material 170. The via is filled with conductive material 340 such as tungsten (W) and barrier material 350 such as a combination of titanium (Ti) and titanium nitride (TiN). Techniques for introducing dielectric material 330, forming and filling conductive vias, and planarizing are known to those skilled in the art.

FIG. 17 also shows additional conductor or signal line material 320 introduced and patterned to mirror that of first conductor or signal line material 140 (e.g., row line) formed on substrate 100. Mirror conductor line material 320 mirrors first conductor or signal line material 140 and is coupled to first conductor or signal line material 140 through a conductive via. By mirroring a doped semiconductor such as N-type silicon, mirror conductor line material 320 serves, in one aspect, to reduce the resistance of conductor or signal line material 140 in a memory array, such as memory array 5 illustrated in FIG. 1. A suitable material for mirror conductor line material 320 includes an aluminum (Al) material, such as an aluminum alloy, or a tungsten (W) material.

Figure 18:
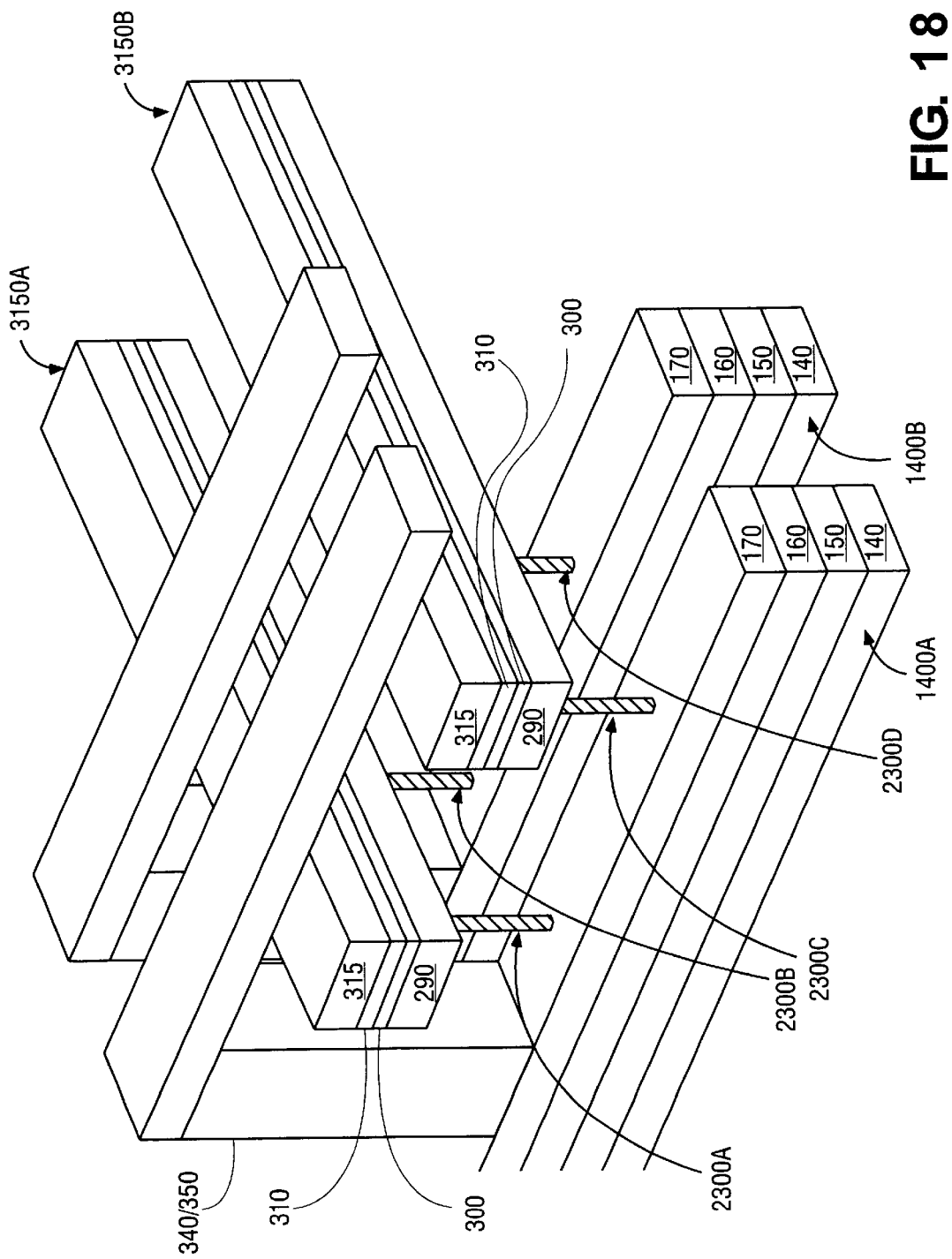
FIG. 18 shows a top perspective view of the structure of FIG. 17 without dielectric material in accordance with an embodiment of the invention.

FIG. 18 shows the structure of FIG. 17 from a top side perspective view. The figure is presented without dielectric material 220 or 310 to illustrate further aspects of the presented structures. In relevant part, FIG. 18 shows two column lines 3150A and 3150B of second conductor or signal line material 315 overlying two row lines 1400A and 1400B of first conductor or signal line material 140. Disposed between column lines 3150A and 3150B and row lines 1400A and 1400B is memory material 290. Memory material 290 is, in this embodiment contiguous with column lines 3150A and 3150B. Thus, FIG. 18 shows two strips of memory material 290. In FIG. 18, electrodes 2300A and 2300B are coupled to a first strip of memory material 290 (and column line 3150A) and row lines 1400A and 1400B. Electrodes 2300C and 2300D are coupled to a second strip of memory material 290 (and column line 3150B) and row lines 1400A and 1400B. It is to be appreciated that, for a given matrix of row and column lines there may be many electrodes coupled to a given volume of memory material contiguous with a column line.

In one embodiment, the electrode material (of electrodes 2300A, 2300B, 2300C, and 2300D) including or not including one or both of the optional barrier materials 275 and 280, is "edgewise adjacent" to memory material 290. That is, only an edge or a portion of an edge of the electrode material is adjacent to memory material 290. Substantially all of the remainder of the electrode is remote to memory material 290. Preferably, substantially all of the electrical communication between the electrode is through an edge of the electrode or a portion of an edge. That is, it is preferable that substantially all electrical communication is through at least a portion of an edge (i.e., an "edge portion") of the electrode.

As used herein the terminology "area of contact" is the portion of the surface of an electrical contact through which the electrical contact electrically communicates with memory material 290. As noted, in one embodiment, substantially all electrical communication between memory material 290 and an electrode occurs through all or a portion of an edge of the electrode. Hence, the area of contact between the electrode and memory material 290 is an edge of the electrode or a portion of an edge of the electrode. That is, the area of contact between the electrode and memory material 290 is an "edge portion" of the electrode. The electrode need not actually physically contact memory material 290. It is sufficient that the electrode is in electrical communication with memory material 290. The area of contact of the electrode and a volume of memory material, being only an edge portion (i.e., an edge or a portion of an edge) of the electrode, is thus very small and is proportional to the thickness of the electrode.

While not wishing to be bound by theory, it is believed that dissipating power in the electrical contact from Joule heating adjacent to memory material 290 may at least partially assist (or may even dominate) the programming of memory material 290. It is also believed that, for the purposes of memory applications (e.g., storage of bits of information), only a small volume of memory material 290 adjacent the electrode is required. Hence, providing a phase change memory material in contact with, for example, several electrode contact structures, and separately in electrical contact with individual row lines, allows several portions of memory material 290 of the same strip to be individually and distinctly programmed.

In one embodiment, a volume of memory material 290 is programmable by the order of phase of the volume of memory material. Joule heating may be used, for example, to amorphize or crystallize a volume of memory material 290 by raising such material to its melting point or to a point between its glass transition temperature and its melting point, respectively. The memory material is chosen, in one example, so that it has a high resistivity in an amorphous phase and a generally lower resistivity in a crystalline phase.

In one embodiment, a strip of memory material 290 contiguous with, for example, a column line of second conductor or signal line material 315, has a representative strip length of 200 microns with several electrodes coupled to the strip representing discrete memory devices. Typically, phase change memory material 290 that is a strip is predominantly in a conductive semi-metallic state with only a small portion of the material immediately surrounding the electrode area of contact undergoing a phase transition. The volume of this phase change region generally depends on the size of the contact and may be estimated at 100 to 200 angstroms larger than the electrode. In one embodiment, it is only necessary to insure that the material in direct contact with the electrode changes phase in order to disconnect the conductive, phase change memory material/column line from the electrode.

Figure 19:
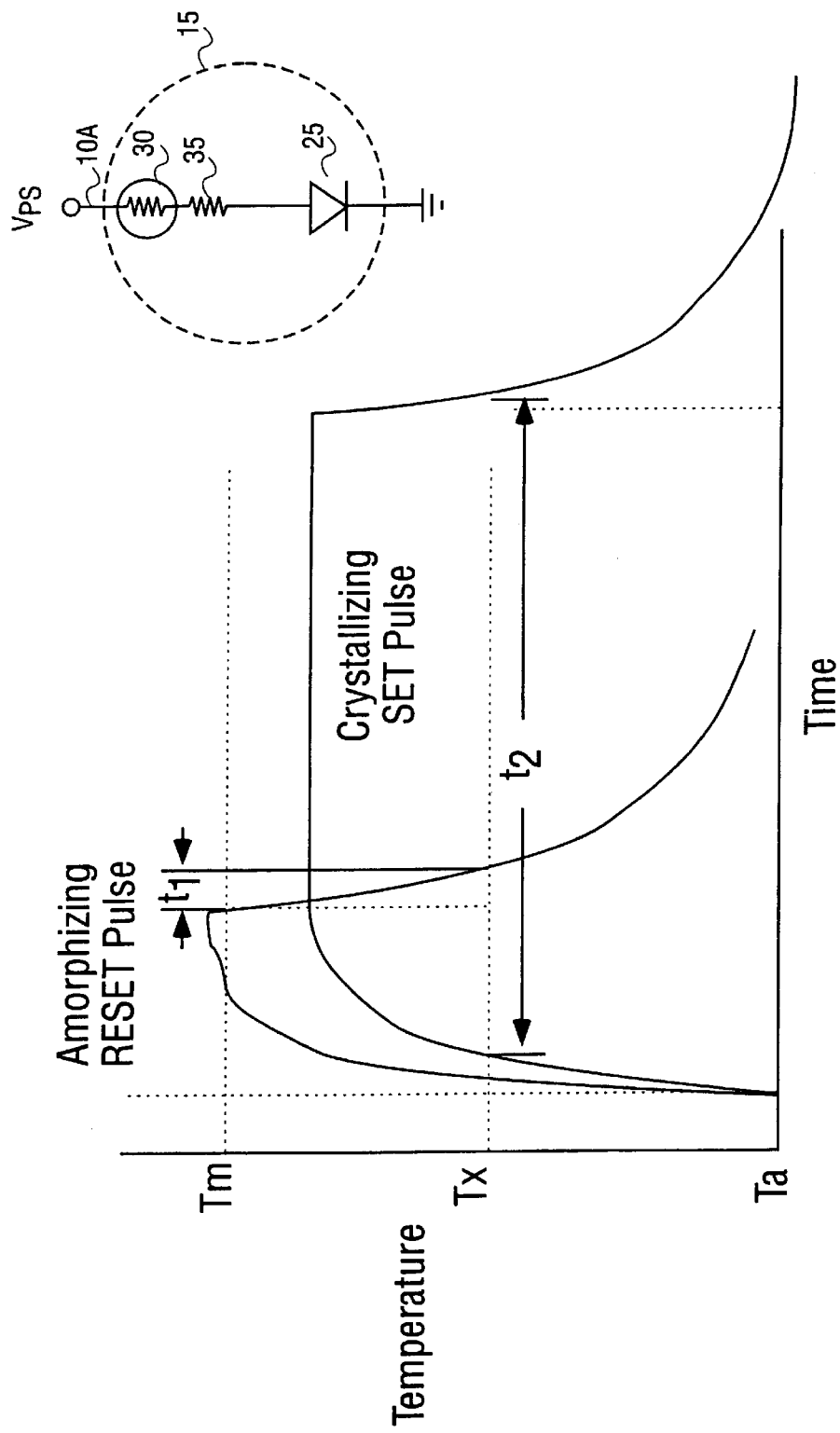
FIG. 19 shows a graphical representation of setting and resetting a volume of a phase change memory material in terms of temperature and time.

FIG. 19 presents a graphical representation of the programming (e.g., setting and resetting) of a volume of phase change memory material. Referring to FIG. 1, programming memory element 15 (addressed by column line 10a and row line 20a) involves, in one example, supplying a voltage to column line 10a to introduce a current into the volume of memory material 30. The current causes a temperature increase at the volume of memory material 30. Referring to FIG. 19, to amorphize a volume of memory material, the volume of memory material is heated to a temperature beyond the amorphisizing temperature, $T_M$ (e.g., beyond the melting point of the memory material). A representative amorphosizing temperature for a $Te_xGe_ySb_z$ material is on the order of about 600° C. to 650° C. Once a temperature beyond $T_M$ is reached, the volume of memory material is quenched or cooled rapidly (by removing the current flow). The quenching is accomplished at a rate, $t_1$, that is faster than the rate at which the volume of memory material 30 can crystallize so that the volume of memory material 30 retains its amorphous state. To crystallize a volume of memory material 30, the temperature is raised by current flow to the crystallization temperature for the material (representatively a temperature between the glass transition temperature of the material and the melting point) and retained at that temperature for a sufficient time to crystallize the material. After such time, the volume of memory material is quenched (by removing the current flow).

In the preceding example, the volume of memory material 30 was heated to a high temperature to amorphosize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 30 can be partially set or reset by varying the current flow and duration through the volume of memory material.

In the above description, a memory device structure was described. Comparing the structure to prior art structures it may be seen that the cellular representation of volumes of memory material is eliminated as is the via coupling of the memory material to an overlying conductor or signal line (e.g., column line). The embodiment of the method of forming a memory device structure is thus simplified as alignment issues related to cellular formation and via placement may be reduced. Further, the size constraints associated with via contact pitch may be eliminated. The proximity of the memory material and column lines also provides an estimated two-fold decrease in column line capacitance, reduced power dissipation, and faster array time constraints. The configuration also frees routing channels as, for example, a metal level on an integrated circuit need not accommodate a column line.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An apparatus comprising:
   a first conductor;
   a second conductor over the substrate and electrically isolated from the first conductor;
   a volume of phase change material over the substrate and disposed contiguous with the second conductor; and
   a plurality of electrodes coupled between the first conductor and the phase change material.

2. The apparatus of claim 1, wherein the first conductor and the second conductor are oriented orthogonally on the substrate.

3. The apparatus of claim 1, wherein the second conductor comprises one of aluminum and tungsten.

4. The apparatus of claim 2, further comprising:
a third conductor disposed over the substrate and coupled to the first conductor.

5. An apparatus comprising:
a first conductor;
a second conductor electrically isolated from the first conductor and extending generally transversely to said first conductor;
a volume of phase change material disposed contiguously with the second conductor; and
a plurality of electrodes electrically connecting the first conductor to the phase change material.

6. The apparatus of claim 5 wherein the second conductor includes one of aluminum and tungsten.

7. The apparatus of claim 5 including a third conductor coupled to the first conductor.

8. The apparatus of claim 5 wherein said plurality of electrodes extend generally transversely to said first and second conductors.

9. The apparatus of claim 5 wherein said first conductor and said second conductor are positioned over a substrate having a horizontal surface, said first and second conductors being generally parallel to said horizontal surface and said electrodes extending generally transversely thereto.

* * * * *